US 8,709,158 B2

(12) United States Patent
Schramm et al.

(10) Patent No.: US 8,709,158 B2
(45) Date of Patent: Apr. 29, 2014

(54) THERMAL MANAGEMENT OF FILM DEPOSITION PROCESSES

(75) Inventors: Sven Schramm, Kahl am Main (DE); Susanne Schläfer, Aschaffenburg (DE)

(73) Assignee: Applied Materials, Inc., Santa Clara, CA (US)

(*) Notice: Subject to any disclaimer, the term of this patent is extended or adjusted under 35 U.S.C. 154(b) by 766 days.

(21) Appl. No.: 12/860,619

(22) Filed: Aug. 20, 2010

(65) Prior Publication Data

US 2012/0040485 A1 Feb. 16, 2012

(30) Foreign Application Priority Data

Aug. 16, 2010 (EP) .................................. 10172965

(51) Int. Cl.
*C23C 16/00* (2006.01)

(52) U.S. Cl.
USPC ............................................ 118/724; 118/69

(58) Field of Classification Search
USPC .................................................. 118/724, 69
See application file for complete search history.

(56) References Cited

U.S. PATENT DOCUMENTS

| | | | | |
|---|---|---|---|---|
| 2,149,406 | A | * | 3/1939 | Siedle ............................... 62/491 |
| 4,838,347 | A | * | 6/1989 | Dentini et al. ................. 165/185 |
| 5,704,089 | A | * | 1/1998 | Walters ............................ 15/227 |
| 5,814,392 | A | * | 9/1998 | You et al. ....................... 428/209 |
| 6,530,990 | B2 | | 3/2003 | Kong et al. |
| 6,550,531 | B1 | | 4/2003 | Searls et al. |
| 7,055,341 | B2 | | 6/2006 | Nori et al. |
| 7,220,365 | B2 | * | 5/2007 | Qu et al. .......................... 252/70 |
| 2005/0000682 | A1 | * | 1/2005 | Chien et al. ................... 165/80.3 |
| 2005/0126757 | A1 | * | 6/2005 | Bennett et al. ............ 165/104.11 |
| 2008/0121374 | A1 | * | 5/2008 | Wang et al. ...................... 165/95 |
| 2008/0251376 | A1 | | 10/2008 | Takizawa et al. |

FOREIGN PATENT DOCUMENTS

| | | |
|---|---|---|
| JP | 52 060279 | 5/1977 |
| JP | 53 100936 | 9/1978 |
| JP | 53100936 | 9/1978 |

OTHER PUBLICATIONS

European Search Report for EP Application No. 10172965.5 dated Mar. 21, 2011, 5 pages.
Uncertified machine translation of JP53100936 (7 pages).

* cited by examiner

*Primary Examiner* — Keath Chen
(74) *Attorney, Agent, or Firm* — Fish & Richardson P.C.

(57) ABSTRACT

Thermal management of film deposition processes. In one aspect, a deposition system includes a vacuum chamber defining an evacuated interior volume, a deposition source disposed within the interior volume, a substrate holder disposed within the interior volume and arranged to hold a substrate with a first surface of the substrate facing the deposition source and a second surface of the substrate disposed facing away from the deposition source, and a heat sink disposed to have a first side of the heat sink in radiative thermal contact with the second surface of the substrate held by the substrate holder, the first side of the heat sink comprising a collection of features having a longitudinal dimension that is four or more times larger than a lateral dimension between the features, the features thereby dimensioned and aligned to reflect, multiple times in succession, radiative thermal emissions of the second surface of the substrate.

20 Claims, 5 Drawing Sheets

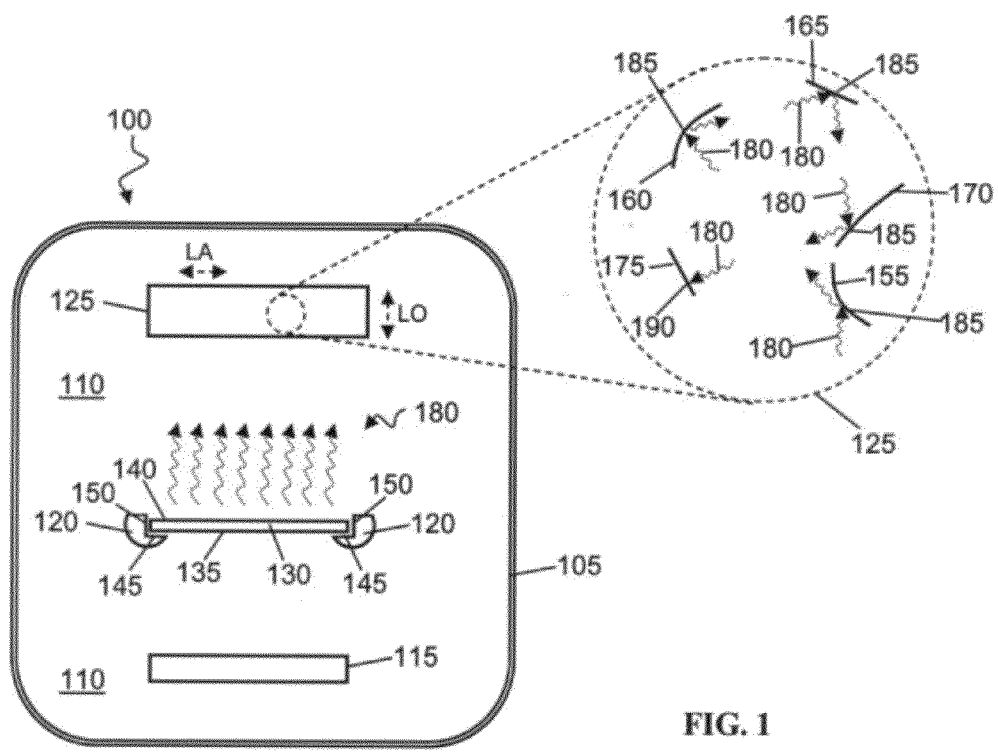
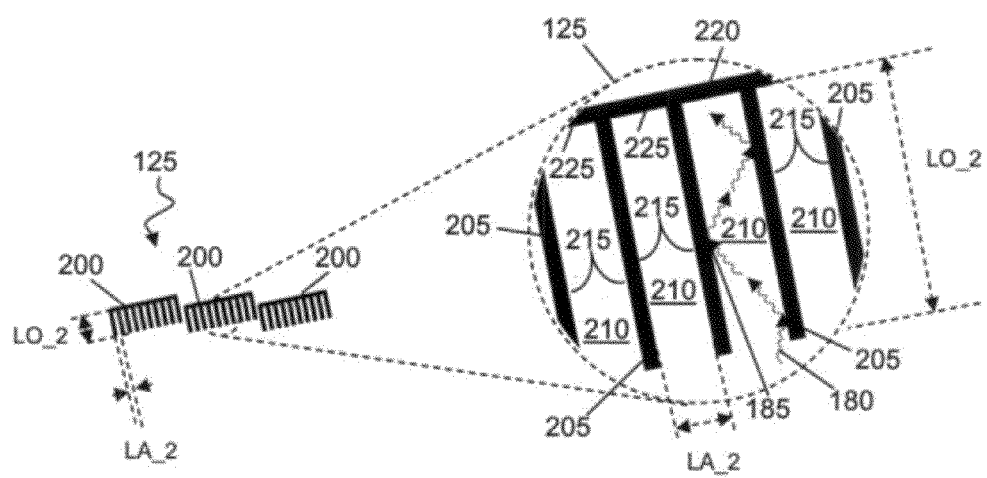
FIG. 1
FIG. 2

THERMAL MANAGEMENT OF FILM DEPOSITION PROCESSES

CROSS-REFERENCE TO RELATED APPLICATION

This application claims priority to European Patent Application Serial No. 10172965.5, filed on Aug. 16, 2010, the contents of which are incorporated herein by reference.

BACKGROUND

This specification relates to thermal management of film deposition processes, e.g., during the manufacture of solar cells and other devices.

Thin and other films can be formed on substrates using a variety of different deposition processes. Examples include physical deposition processes in which a deposition source is energized so that matter escapes from the deposition source. At least a portion of the escaped matter contacts a target substrate, de-energizes, and forms a solid film. For a variety of different reasons—including the need to maintain sufficient film purity—physical deposition processes are generally performed in a low pressure deposition environment (e.g., in an evacuated vacuum chamber).

Evaporation is one example of a physical deposition process. Evaporation sources can be energized using, e.g., a resistance or other heater or an electron beam to raise the vapor pressure of the source in the deposition environment. At least a portion of the vaporized source material condenses on a substrate and forms a solid film.

The deposition of matter at a substrate can transfer at least some of the energy that allowed the matter to escape from the deposition source to the substrate. For example, the condensation of vapor on a substrate will heat the substrate. Excessive heating can, e.g., damage microelectronic components on the substrate or melt portions of the substrate. The rate of deposition can be kept relatively low so that the rate of energy transfer from the deposition source to the substrate is also kept relatively small. However, slower rates of deposition increase processing times and decrease yield per unit time.

SUMMARY

This specification describes systems and techniques for thermal management of film deposition processes. In particular, energy that is transferred to a substrate during deposition can be removed from the substrate allowing the rate of deposition and yield to be increased. The described systems and techniques may even allow relatively thick films—such as those needed in solar cells—to be formed quickly.

In a first aspect for thermal management of film deposition processes, a deposition system includes a vacuum chamber defining an evacuated interior volume, a deposition source disposed within the interior volume, a substrate holder disposed within the interior volume and arranged to hold a substrate with a first surface of the substrate facing the deposition source and a second surface of the substrate disposed facing away from the deposition source, and a heat sink disposed to have a first side of the heat sink in radiative thermal contact with the second surface of the substrate held by the substrate holder, the first side of the heat sink comprising a collection of features having a longitudinal dimension that is four or more times larger than a lateral dimension between the features, the features thereby dimensioned and aligned to reflect, multiple times in succession, radiative thermal emissions of the second surface of the substrate.

This first aspect can include one or more of the following features. The features can be protrusions from the heat sink that define inter-protrusion spaces, the protrusions spaced apart and aligned so that the inter-protrusion spaces defined by protrusion surfaces receive the radiative thermal emissions from the substrate held by the substrate holder for multiple successive reflections off the protrusion surfaces. The features can include surfaces that define concavities, the surfaces spaced apart by an opening aligned to receive the radiative thermal emissions from the substrate held by the substrate holder for multiple successive reflections off the concavity surfaces. The protrusion or concavity surfaces can be generally planar. The concavities can be defined by rounded surfaces. Each of the concavities can be dimensioned and aligned to reflect thermal emissions received by the concavity three or more times in succession within each concavity. Each of the concavities can be dimensioned and aligned to reflect, multiple times in succession within the respective concavity, more than 70% of the radiative thermal emissions of the second surface of the substrate that are received by the respective concavity. The heat sink can be oriented such that deposition of material from the deposition source is not uniform on all of the protrusion or concavity surfaces.

In a second aspect, a deposition system includes a vacuum chamber defining an evacuated interior volume, a deposition source disposed within the interior volume, a substrate holder disposed within the interior volume and arranged to hold a collection of substrates each with a first surface of the substrate facing the deposition source and with a second surface of the substrate disposed facing away from the deposition source, and a collection of non-metallic thermal masses removably disposed within the interior volume to have a first side of each thermal mass in thermal contact with a respective second surface of each substrate held by the substrate holder.

This second aspect can include one or more of the following features. The thermal masses can be glass or graphite members. The final masses can be slabs each dimensioned to be laid on the respective second surface of each substrate held by the substrate holder. The thermal mass slabs can be between 2 and 8 mm thick.

In a third aspect, an apparatus for deposition of one or more layers onto a substrate includes a vacuum chamber defining a volume, a source arranged within the volume, a substrate holder arranged within the volume and configured to hold a substrate with a first surface facing the source and a second surface facing away from the source, and a heat sink member arranged within the volume having a first side facing the second surface of the substrate. The first side of the heat sink member includes protruding features arranged to enhance the absorbance of electromagnetic radiation of the heat sink member.

This third aspect can include one or more of the following features. The protruding features can define inter-protrusion spaces. The protruding features can be spaced apart and aligned so that the inter-protrusion spaces defined by protruding features receive the radiative thermal emissions from the substrate held by the substrate holder for multiple successive reflections off the surfaces of the protruding features. The surfaces of the protruding features can be generally planar. The heat sink can be oriented such that deposition of material from the deposition source is not uniform on all of the surfaces of the protruding features.

In a fourth aspect, a deposition system includes a vacuum chamber defining an evacuated interior volume, a deposition source disposed within the interior volume, a substrate holder disposed within the interior volume and arranged to hold a substrate with a first side of the substrate facing the deposition source and a second side of the substrate disposed facing away from the deposition source, and a heat sink disposed to have a first side of the heat sink in radiative thermal contact with the second side of the substrate held by the substrate holder. The first side of the heat sink includes a collection of concavities each dimensioned and aligned to reflect, multiple times in succession within the respective concavity, radiative thermal emissions of the second side of the substrate that are received by the respective concavity.

This fourth aspect can include one or more of the following features. The concavities can be defined by surfaces that are spaced apart by an opening aligned to receive the radiative thermal emissions from the substrate held by the substrate holder for multiple successive reflections off the concavity surfaces. The concavity surfaces can be generally planar. The concavities can be defined by rounded surfaces. The concavities can be dimensioned and aligned to reflect thermal emissions received by the concavity three or more times in succession within each concavity. Each of the concavities can be dimensioned and aligned to reflect, multiple times in succession within the respective concavity, more than 70% of the radiative thermal emissions of the second surface of the substrate that are received by the respective concavity. The heat sink can be oriented such that deposition of material from the deposition source is not uniform on all of the concavity surfaces.

Any of the first, the second, the third, and the fourth aspects can include one or more of the following features. The deposition system can include a cooling system arranged to cool the heat sink by transport of heated mass away from the heat sink. Radiative thermal emissions from the second surface of the substrate propagate to the first side of the heat sink without reflecting off an intermediate member. The deposition source can be an aluminum evaporation source. The substrate can be a wafer. The deposition system of can include a cleaning member that includes a feature that is dimensioned to snugly fit within spaces between the features of the heat sink. The heat sink can be disposed to be substantially isolated from convective or conductive thermal contact with the substrate held by the substrate holder.

A device can be fabricated using any of the deposition systems according to any of the aspects. For example, a solar cell can be fabricated by evaporation depositing a layer of aluminum that is at least 10 nanometers thick on the substrate.

The details done or more implementations are set forth in the accompanying drawings and the description below. Other features and advantages will be apparent from the description and drawings, and from the claims.

DESCRIPTION OF DRAWINGS

FIG. 1 is a schematic representation of a deposition system.

FIG. 2 is a schematic cross-sectional illustration of an example implementation of a heat sink formed of one or more one or more heat sink members

Like reference symbols in the various drawings indicate like elements.

DETAILED DESCRIPTION

Figure 3:
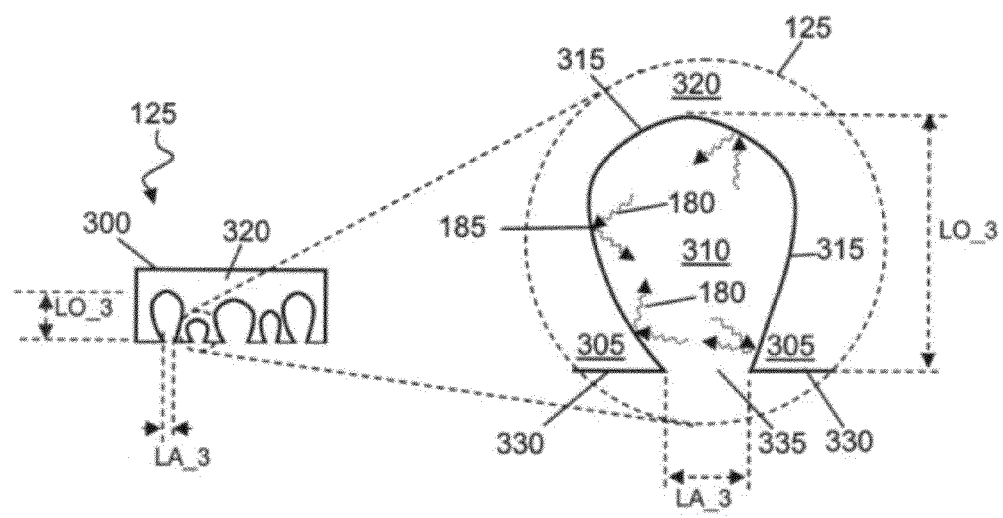
FIG. 3 is a schematic cross-sectional illustration of an example implementation of a heat sink member.

FIG. 1 is a schematic representation of a deposition system 100. Deposition system 100 includes a vacuum chamber 105 that defines an interior volume 110. Deposition system 100 also includes a deposition source 115, a substrate holder 120, and a heat sink 125 disposed within interior volume 110. Substrate holder 120 is positioned to hold a substrate 130 with a first, working surface 135 facing deposition source 115 and a second surface 140 facing away from deposition source 115. Heat sink 125 is positioned to receive radiative thermal emissions 180 from a substrate 130 that is held by substrate holder 120 so that energy transferred to substrate 130 during deposition can be removed from substrate 130 and the rate of deposition increased.

Deposition source 115 is a source of the material that is to be deposited as a film. Deposition source 115 can be in a variety of different forms including, e.g., a bulk solid, a wire, a coil, a foil, or the like. Deposition source 115 can be energized in a variety of different ways including, e.g., contact between the material that is to be deposited and a heated crucible, boat, filament, or other member, the passage of electrical current through an element that includes the material that is to be deposited, and striking the material that is to be deposited with an electron or other beam. In some implementations, deposition source 115 can be a source of vapor that is to be vapor deposited on a substrate. For example, deposition system 100 can be an aluminum evaporator that is capable of forming aluminum layers that are between, e.g., 10 nanometers and 25 micrometers, or between 1 micrometer and 25 micrometers thick in solar cell and other relatively thicker film applications.

Substrate holder 120 is a mechanical member that is arranged to hold at least one substrate 130 during a deposition process. In the illustrated implementation, substrate holder 120 holds substrate 130 at a position defined by vertical sidewalls 150 and supports a perimetric portion of the working surface 135 of substrate 130 from below with horizontal surfaces 145. A substrate 130 can be loaded into substrate holder 120 and held at a desired position relative to the remainder of substrate holder 120. With substrate holder 120 loaded into and positioned within vacuum chamber 105, working surface 135 faces deposition source 115 and surface 140 faces away from deposition source 115.

Heat sink 125 is a device that removes at least some of the energy transferred during deposition to a substrate 130 in substrate holder 120. In some implementations, heat sink 125 can remove this energy transferred almost exclusively by absorbing radiative thermal emissions 180 from substrate 130 and, aside from incidental coupling through mechanical structures, can be substantially isolated from convective or conductive thermal contact with substrate 130. Heat sink 125 includes a collection of features 155, 160, 165, 170, 175. Features are dimensioned and arranged to reflect and absorb radiative thermal emissions 180 from a substrate 130 in substrate holder 120 during a deposition process. Radiative thermal emissions 180 are infrared or other electromagnetic radiation emitted from a substrate 130. As energy is transferred from deposition source 115 to substrate 130 during deposition, substrate 130 heats and the characteristics of radiative thermal emissions 180 change. In evaporation deposition processes, radiative thermal emissions 180 can be characteristic of substrate 130 being at temperatures ranging from, e.g., above 100° C. to below or well below the melting point of the material being deposited, such as, e.g., below 660° C. in aluminum deposition or more particularly to below approximately 350° C.

After zero or more reflection events, radiative thermal emissions 180 from substrate 130 are absorbed by heat sink 125. In the implementation illustrated in FIG. 1, four successive reflection events 185, followed by an absorption event 190, are shown for a single photonic radiative thermal emission 180. Different radiative thermal emissions 180—in both the implementation of heat sink 125 illustrated in FIG. 1 and in other implementations of heat sink 125 (e.g., FIGS. 2, 3, 4)—undergo different numbers of reflection events 185. The reflection events can be specular reflection events (as shown), diffuse reflection events, or combinations of specular and diffuse reflection events.

As the number of reflection events increases, the net likelihood that a particular radiative thermal emission 180 is absorbed by heat sink 125 increases. Since radiative thermal emission 180 that are not absorbed by heat sink 125 may, in some instances, return to be absorbed by substrate 130, the net likelihood that radiative thermal emissions 180 are absorbed by heat sink 125 can determine the rate of energy transfer between a substrate 130 and heat sink 125. Heat sink 125 is therefore arranged and dimensioned to reflect many of the radiative thermal emissions 180 that pass through or originate from surface 140 of a substrate 130 in holder 120 multiple times in succession before reflecting back to the substrate.

As described further below, multiple successive reflections of such radiative thermal emissions 180 by heat sink 125 can be obtained, e.g., by a heat sink 125 that includes features having a longitudinal dimension (i.e., in the longitudinal direction LO) that is larger than a space defined in the lateral dimension (i.e., in the lateral direction LA) between those features. In some implementations, the longitudinal dimension of the features is twice as large or larger than a space defined in the lateral dimension between those features. In some implementations, the longitudinal dimension of the features is four times as large or larger than a space defined in the lateral dimension between those features. In the illustrated implementation, the lateral direction LA is generally parallel to surface 140 of a substrate 130 in holder 120 and heat sink 125. This is not however always true. For example, the features of heat sink 125, and the spaces between the features, can be oriented obliquely relative to surface 140 to shield at least some of the features from deposition, as discussed further below. As another example, one or more reflective surfaces (e.g., a mirror) can be positioned to reflect radiative thermal emissions 180 that pass through or originate from surface 140 of a substrate 130 in holder 120 toward a heat sink 125 that is oriented, e.g., with lateral direction LA oblique to or even perpendicular to surface 140 of a substrate 130 in holder 120.

FIG. 2 is a schematic cross-sectional illustration of an example implementation of a heat sink 125 formed of one or more one or more heat sink members 200. Heat sink members 200 each include a collection of features 205 that are laterally separated to define spaces 210 between them. Features 205 have a longitudinal dimension LO_2. Spaces 210 between features 205 have a lateral dimension LA_2. In general, longitudinal dimension LO_2 is at least as large as lateral dimension LA_2. In some implementations, longitudinal dimension LO_1 is at least twice as large as lateral dimension LA_2. In some implementations, longitudinal dimension LO_2 is at least four times as large as lateral dimension LA_2. Such dimensioning of features 205 can increase the likelihood that radiative thermal emissions from a substrate will undergo multiple successive reflections from surfaces of heat sink 125, which in turn increases the likelihood that the radiative thermal emissions are absorbed by heat sink 125.

In the illustrated implementation, features 205 are generally planar members that extend into and out of the page. Each feature 205 includes a pair of side walls 215 that define spaces 210. When positioned within system 100, side walls 215 are skewed relative to the shortest path followed by radiative thermal emissions from a substrate 130 in holder 120 to heat sink 125. Such positioning hinders radiative thermal emissions from entering spaces 210, reflecting once off surface portions 225, and exiting spaces 210, e.g., to return to substrate 130. Instead, a relatively large fraction (e.g., a majority) of the radiative thermal emissions 180 from substrate 130 undergo successive reflection events 185 in heat sink 125 from side walls 215, increasing the net likelihood of an absorption event.

In the illustrated implementation, heat sink 125 includes a back member 220 that holds features 205 in place. Back member 220 includes a collection of surface portions 225 that also define spaces 210. Radiative thermal emissions from a substrate 130 in holder 120 can also reflect from or be absorbed by surface portions 225. In some implementations, back member 220 includes fluid conduits that are used in conjunction with a cooling system that removes heated fluid from vacuum chamber 105, as described further below.

FIG. 3 is a schematic cross-sectional illustration of an example implementation of a heat sink member 300. One or more heat sink members 300 can be used to form heat sink 125 (FIG. 1). Heat sink member 300 includes a collection of features 305 that are laterally separated to define spaces 310 between them. Features 305 have a longitudinal dimension LO_3. Spaces 310 between features 305 have a lateral dimension LA_3. In general, longitudinal dimension LO_3 is at least as large as lateral dimension LA_3. In some implementations, longitudinal dimension LO_3 is at least twice as large as lateral dimension LA_3. In some implementations, longitudinal dimension LO_3 is at least four times as large as lateral dimension LA_3. Such dimensioning of features 305 can increase the likelihood that radiative thermal emissions from a substrate will undergo multiple successive reflections from surfaces of heat sink member 300, which in turn increases the likelihood that the radiative thermal emissions are absorbed by heat sink 125.

In the illustrated implementation, features 305 have outer surfaces 330 and inner surfaces 315. Outer surfaces 330 are generally congruent with and form an outer surface of heat sink 125. Inner surfaces 315 are curved and define generally rounded spaces 310. Spaces 310 open at openings 335 at outer surfaces 330 of features 305. Lateral dimension LA_3 is defined at these openings 335. Radiative thermal emissions 180 can enter spaces 310 through openings 335 and undergo successive reflection events 185 off curved inner surfaces 315 in heat sink 125. Inner surfaces 315 of features 305 can be curved so that a majority of the radiative thermal emissions 180 that enter spaces 310 are reflected a sufficient number of times to make absorption nearly certain. In some implementations, heat sink 125 can be approximated as a black body absorber.

In the illustrated implementation, heat sink member 300 includes a back member 320 that holds features 305 in place. In some implementations, back member 320 includes fluid conduits that are used in conjunction with a cooling system that removes heated fluid from vacuum chamber 105, as described further below.

Figure 4:
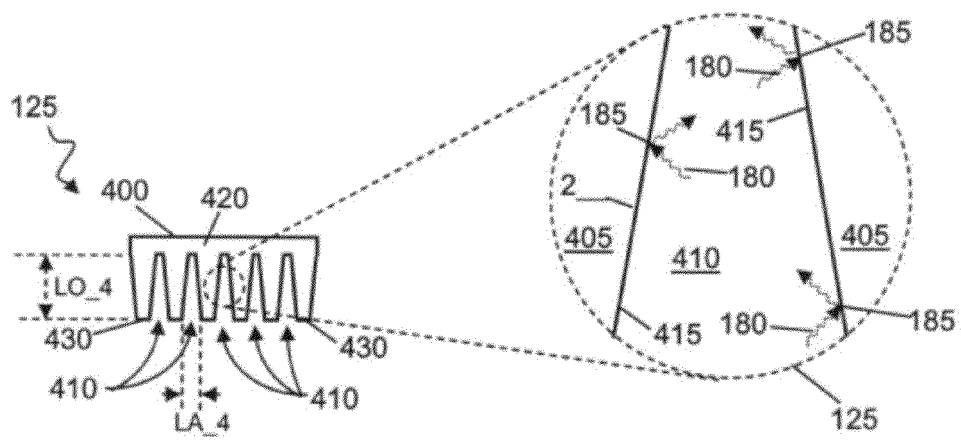
FIG. 4 is a schematic cross-sectional illustration of an example implementation of a heat sink member.

FIG. 4 is a schematic cross-sectional illustration of an example implementation of a heat sink member 400. One or more heat sink members 400 can be used to form heat sink 125 (FIG. 1). Heat sink member 400 includes a collection of features 405 that are laterally separated to define spaces 410 between them. Features 405 have a longitudinal dimension LO_4. Spaces 410 between features 405 have a lateral dimension LA_4. In general, longitudinal dimension LO_4 is at least as large as lateral dimension LA_4. In some implementations, longitudinal dimension LO_4 is at least twice as large as lateral dimension LA_4. In some implementations, longitudinal dimension LO_4 is at least four times as large as lateral dimension LA_4. Such dimensioning of features 405 can increase the likelihood that radiative thermal emissions from a substrate will undergo multiple successive reflections from surfaces of heat sink member 400, which in turn increases the likelihood that the radiative thermal emissions are absorbed by heat sink 125.

In the illustrated implementation, features 405 have outer surfaces 430 and inner surfaces 415. Outer surfaces 430 are generally congruent with and form an outer surface of heat sink 125. Inner surfaces 415 are generally planar and intersect outer surfaces 430 obliquely to define a collection of spaces 410 that narrow laterally moving away from outer surfaces 430. Lateral dimension LA_4 is defined at the openings of spaces 410 at outer surfaces 430. Radiative thermal emissions 180 can enter spaces 410 through openings at outer surfaces 430 and undergo successive reflection events 185 off inner surfaces 415 in heat sink member 400.

In the illustrated implementation, heat sink member 400 includes a back member 420 that holds features 405 in place. In some implementations, back member 420 includes fluid conduits that are used in conjunction with a cooling system that removes heated fluid from vacuum chamber 105 as described further below.

Heat sink members (e.g., members 200, 300, 400) can be oriented in deposition systems such that deposition of material from the deposition source onto heat sink 125 is not uniform on all of the surfaces (e.g., surfaces 215, 225, 315, 415) that define the spaces (e.g., spaces 210, 310, 410) between features (e.g., features 205, 305, 405). In this regard, source material may be relatively unlikely to absorb radiative thermal emissions. Although surfaces of a new heat sink can be formed of a material that is relatively likely to absorb radiative thermal emissions (e.g., materials such as graphite), with use even relatively low rates of deposition of source material onto heat sink 125 can build up films and decrease the net absorption of radiative thermal emissions by heat sink 125. One example of a graphite material is HYDROKOL-LAG, which is a product of ACHESON COLLOIDEN B.V. (Netherlands), which is an aqueous graphite designed for castings of aluminium and other metals and that forms a heat-resistant film resistant.

If the rate of source material deposition onto at least some surfaces that are accessible to the radiative thermal emissions (e.g., after one or more reflection events) is relatively lower than the rate of source material deposition onto other portions, the net rate of decrease in absorption of the heat sink as a whole can be decreased. In other words, absorption of radiative thermal emissions can remain likely at surfaces onto which source material does not, or is slow to, deposit.

In some implementations, non-uniform deposition of source material can be achieved by obliquely positioning heat sink relative to the line of sight from the deposition source 115 so that only a portion of the surfaces (e.g., surfaces 215, 225, 315, 415) that define the spaces (e.g., spaces 210, 310, 410) are visible along this line of sight. For example, one or more heat sink members can be positioned oblique to this line of sight, e.g., as would be the case if the heat sink members 200 illustrated in FIG. 2 were positioned with the illustrated orientation within deposition system 100 (FIG. 1).

Figure 5:
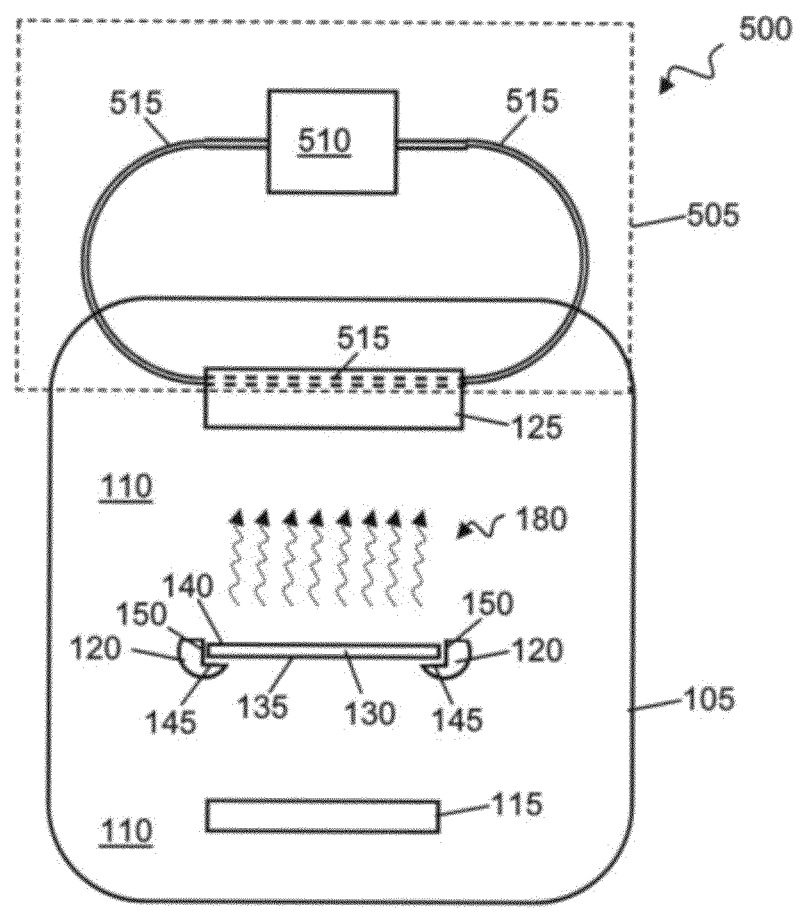
FIG. 5 is a schematic representation of a deposition system.

FIG. 5 is a schematic representation of a deposition system 500. In addition to vacuum chamber 105, deposition source 115, substrate holder 120, and heat sink 125, deposition system 500 also includes an cooling system 505. Cooling system 505 includes a pump 510 and a conduit system 515. In operation, pump 510 transports fluids through conduit system 515. Conduit system 515 guides the fluids into vacuum chamber 105, into thermal contact with heat sink 125, and out of vacuum chamber 105.

In the illustrated implementation, thermal contact between heat sink 125 and the driven fluid is achieved by physical contact between the driven fluid and a portion of conduit system 515 that passes through heat sink 125. Further, the driven fluid returns to pump 510 via conduit system 515. However, other arrangements are possible. For example, conduit system 515 can be in thermal contact with a mount for heat sink 125 that is itself in thermal contact with heat sink 125. As another example, the driven fluid can be vented, e.g., to atmosphere. In any case, at least some of the heat transferred to heat sink 125 from substrate 130 is transferred to the driven fluid and exits vacuum chamber 105 with the fluid.

Figure 6:
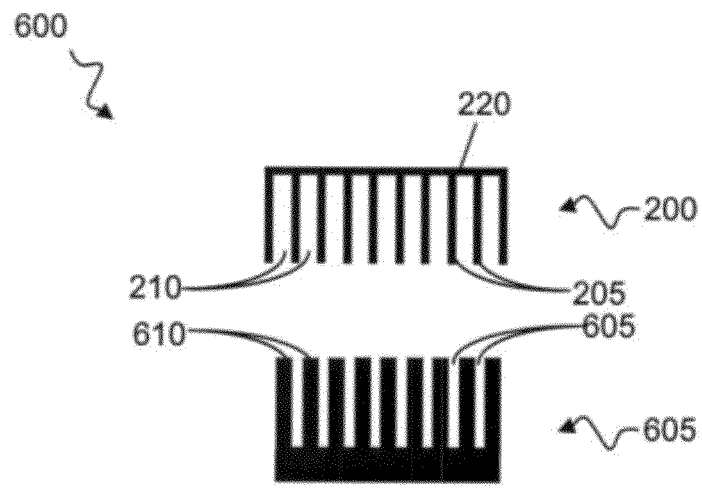
FIGS. 6 and 7 are schematic cross-sectional illustration of example implementations of heat sink cleaning systems.
Figure 7:
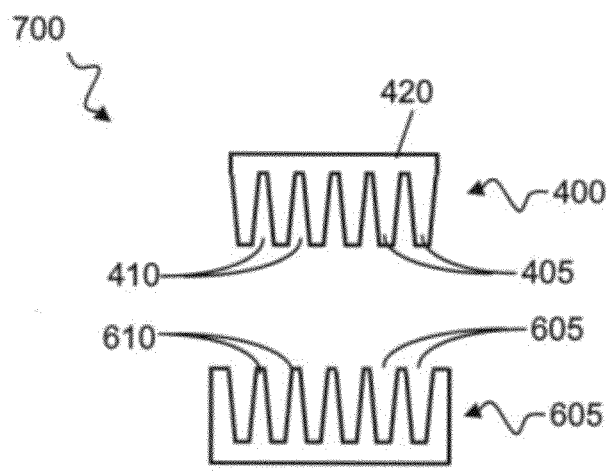

FIGS. 6 and 7 are schematic cross-sectional illustration of example implementations of heat sink cleaning systems 600, 700. As described above, even relatively small deposits of source material can build up with use and decrease the net absorption of radiative thermal emissions by the heat sink. Heat sink cleaning system 600 can be used to remove such deposits and increase the likelihood that radiative thermal emissions are absorbed by the heat sink. Heat sink cleaning systems 600, 700 can be used in isolation or in conjunction with deposition systems such as, e.g., systems 100, 500, 800.

Heat sink cleaning systems 600, 700 each include a respective heat sink member 200, 400 and cleaning member 605. Each cleaning member 605 includes one or more features 610 that define zero or more spaces 605. At least some of features 610 are dimensioned to snugly fit within spaces (e.g., spaces 210, 410) of a corresponding heat sink member 200, 400. As needed, spaces 605 are dimensioned to snugly receive features (e.g., features 205, 405) of a corresponding heat sink member 200, 400.

In use, a heat sink member 200, 400 onto which source material has been deposited can be heated. A corresponding cleaning member 605 can be forced through the heated heat sink member 200, 400, e.g., in the direction into and out of the page. With appropriate dimensioning of cleaning member 605 relative to its corresponding heat sink 125, source material can be driven out of the heat sink member 200, 400.

Figure 8:
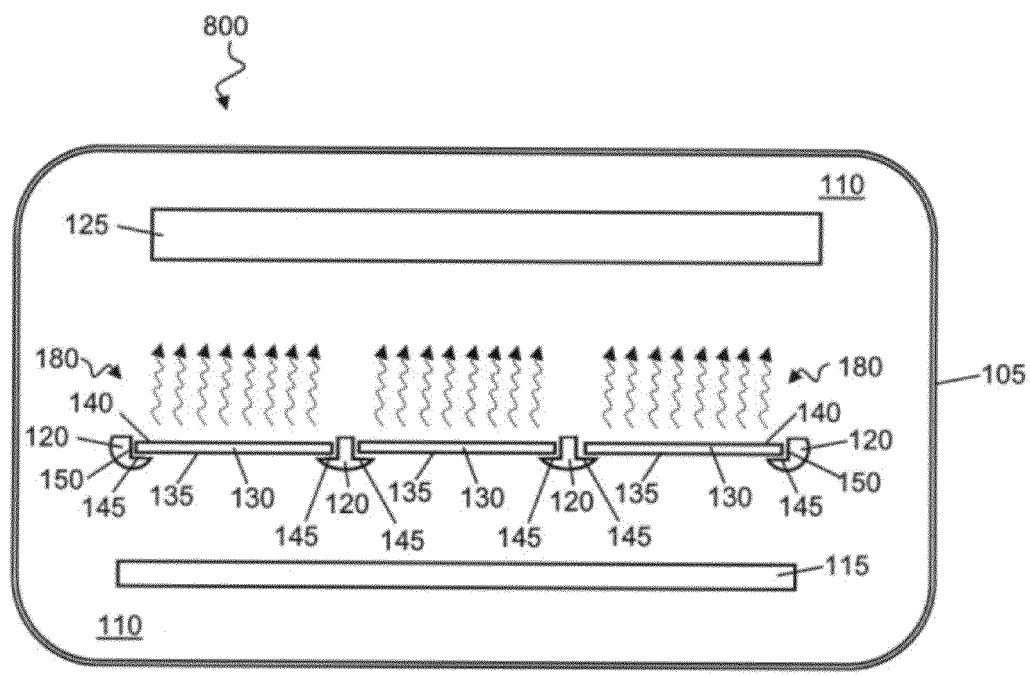
FIG. 8 is a schematic representation of a deposition system.

FIG. 8 is a schematic representation of a deposition system 800. Deposition system 800 includes one or more deposition sources 115, two or more substrate holders 120, and one or more heat sinks 125 disposed within interior volume 110. Substrate holders 120 are positioned to hold a collection of substrates 130 with working surfaces 135 facing deposition source(s) 115 and surfaces 140 facing away from deposition source(s) 115. Heat sink(s) 125 are positioned to receive radiative thermal emissions 180 from these substrates 130 so that energy transferred to substrates 130 during deposition can be removed. In some implementations, deposition system 800 can also include a cooling system such as, e.g., cooling system 505 (FIG. 5).

Figure 9:
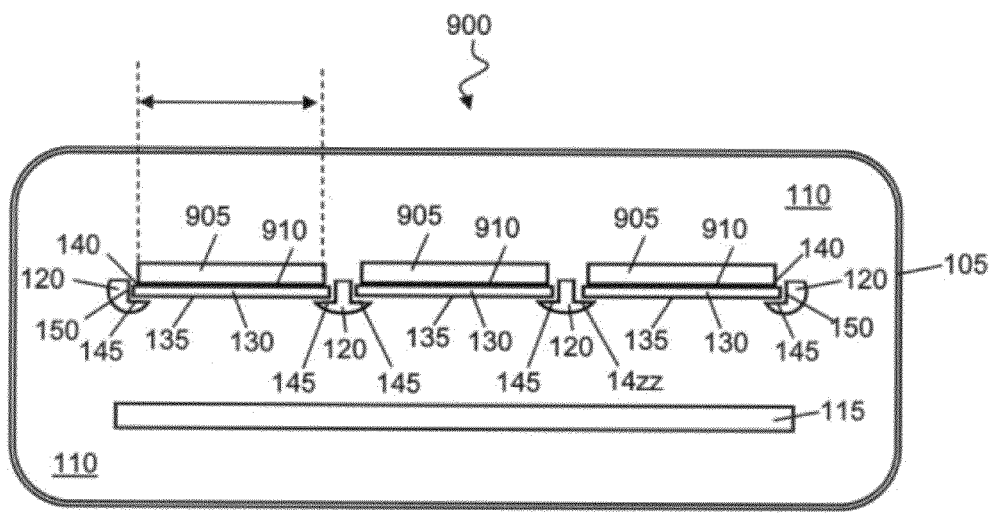
FIG. 9 is a schematic representation of a deposition system.

FIG. 9 is a schematic representation of a deposition system 900. Deposition system 900 includes one or more deposition sources 115, two or more substrate holders 120, and two or more thermal ballasts 905. Thermal ballasts 905 are mechanical members that have a thermal mass and include a surface 910 that can be positioned in contact with at least a portion of surface 140 of a substrate 130 that is held by a substrate holder 120 to provide conductive heat transport between such a substrate 130 and the thermal ballast 905. With such conductive heat transport between a substrate 130 and a thermal ballast 905, additional energy must be transferred from a deposition source 115 to cause a unit temperature increase at substrate 130. In general, thermal ballasts 905 have a thermal mass that is higher than the thermal mass of substrates 130.

Thermal ballasts 905 are generally non-metallic and can be made, e.g., out of glass or graphite. In some implementations, thermal ballasts 905 can also be made out of a metal material 1 covered with a film that is relatively likely to absorb radiative thermal emissions (e.g., a graphite paint).

In some implementations, thermal ballasts 905 are generally slab-shaped and can be, e.g., between 2 and 8 mm thick. In some implementations, thermal ballasts 905 can be dimensioned to extend over horizontal surfaces 145 of substrate holder 120 so that the weight of thermal ballasts 905 is supported by substrate holder 120 and substrates 130 do not flex excessively.

In operation, substrates 130 can be loaded onto substrate holders 120 and thermal ballasts 905 can be positioned on surfaces 140. The substrate holders 120 can be introduced to vacuum chamber 105 and deposition processes performed. After completion of the deposition processes, substrate holders 120 can be removed from vacuum chamber 105 and thermal ballasts 905 can be removed from substrates 130. If appropriate, the substrate holders 120 (and the loaded substrates 130) can be introduced into a different processing system. In some implementations, thermal ballasts 905 are disposable and used a limited number of times before being discarded.

A number of implementations have been described. Nevertheless, it will be understood that various modifications may be made. Accordingly, other implementations are within the scope of the following claims.

What is claimed is:

1. A deposition system comprising:
    a vacuum chamber defining an evacuated interior volume;
    a deposition source disposed within the interior volume;
    a substrate holder disposed within the interior volume and arranged to hold a substrate with a first surface of the substrate facing the deposition source and a second surface of the substrate disposed facing away from the deposition source; and
    a heat sink having a generally planar member disposed to have a first side of the heat sink in radiative thermal contact with the second surface of the substrate held by the substrate holder, the first side of the heat sink comprising a collection of features in parallel to each other, the features comprising protrusions extending from or recesses extending into the generally planar member, the features having a longitudinal dimension extending toward the second surface and perpendicular to the generally planar member, the features being separated by a lateral dimension parallel to the second surface, wherein the longitudinal dimension is two or more times larger than the lateral dimension between the features, the features thereby dimensioned and aligned to reflect, multiple times in succession, radiative thermal emissions of the second surface of the substrate,
    wherein the generally planar member, the features of the heat sink, and spaces between the features are oriented obliquely relative to the second surface to shield at least some of the features from deposition.

2. The deposition system of claim 1, wherein the features are protrusions from the generally planar member of the heat sink that define inter-protrusion spaces, the protrusions spaced apart and aligned so that the inter-protrusion spaces defined by protrusion surfaces receive the radiative thermal emissions from the substrate held by the substrate holder for multiple successive reflections off the protrusion surfaces.

3. The deposition system of claim 2, wherein the protrusion surfaces are generally planar.

4. The deposition system of claim 3, wherein a depth of inter-protrusion spaces along the longitudinal dimension is at least four times as long as a width of the of inter-protrusion spaces along the lateral dimension.

5. The deposition system of claim 4, wherein facing protrusion surfaces of adjacent protrusions are angled such that the inter-protrusion spaces are wider on a side closer to the substrate.

6. The deposition system of claim 5, wherein the protrusions have a cross section perpendicular to the longitudinal dimension and perpendicular to the lateral dimension, and wherein the cross-section comprises a trapezoid.

7. The deposition system of claim 2, wherein the heat sink is oriented such that deposition of material from the deposition source is not uniform on all of the protrusion surfaces.

8. The deposition system of claim 1, wherein the features are recesses into the generally planar member of the heat sink, the recesses providing concavities defined by the surfaces spaced apart by an opening aligned to receive the radiative thermal emissions from the substrate held by the substrate holder for multiple successive reflections off the surfaces.

9. The deposition system of claim 8, wherein the concavity surfaces are generally planar.

10. The deposition system of claim 8, wherein the concavities are defined by rounded surfaces.

11. The deposition system of claim 8, wherein each of the concavities is dimensioned and aligned to reflect the thermal emissions received by the concavity three or more times in succession within each concavity.

12. The deposition system of claim 8, wherein each of the concavities is dimensioned and aligned to reflect, multiple times in succession within the respective concavity, more than 70% of the radiative thermal emissions of the second surface of the substrate that are received by the respective concavity.

13. The deposition system of claim 8, wherein the heat sink is oriented such that deposition of material from the deposition source is not uniform on all of the concavity surfaces.

14. The deposition system of claim 1, wherein the deposition system further comprises a cooling system arranged to cool the heat sink by transport of heated mass away from the heat sink.

15. The deposition system of claim 1, wherein the radiative thermal emissions from the second surface of the substrate propagate to the first side of the heat sink without reflecting off an intermediate member.

16. The deposition system of claim 1, wherein: the deposition source comprises an aluminum evaporation source; and the substrate comprises a wafer.

17. The deposition system claim 1, further comprising a cleaning member that includes a feature that is dimensioned to snugly fit within spaces between the features of the heat sink.

18. The deposition system of claim 1, wherein the heat sink disposed to be substantially isolated from convective or conductive thermal contact with the substrate held by the substrate holder.

19. A deposition system comprising:

a vacuum chamber defining an evacuated interior volume;

a deposition source disposed within the interior volume;

a substrate holder disposed within the interior volume and arranged to hold a substrate with a first side of the substrate facing the deposition source and a second side of the substrate disposed facing away from the deposition source, and a heat sink having a generally planar member disposed to have a first side of the heat sink in radiative thermal contact with the second side of the substrate held by the substrate holder, wherein the first side of the heat sink includes a collection of concavities in parallel to each other, the concavities having a longitudinal dimension extending toward the second side of the substrate and perpendicular to the generally planar member, and each of the concavities dimensioned and aligned to reflect, multiple times in succession within the respective concavity, radiative thermal emissions of the second side of the substrate that are received by the respective concavity, wherein the generally planar member, the concavities of the heat sink, and spaces between the concavities are oriented obliquely relative to the second surface of the substrate such that deposition of material from the deposition source is not uniform on all of the concavity surfaces.

20. The deposition system of claim 19, wherein the concavities are defined by surfaces that are spaced apart by an opening aligned to receive the radiative thermal emissions from the substrate held by the substrate holder for multiple successive reflections off the surfaces.

* * * * *